United States Patent
Kihara

(10) Patent No.: US 6,625,056 B1
(45) Date of Patent: Sep. 23, 2003

(54) SEMICONDUCTOR MEMORY DEVICE HAVING MEMORY CELLS REQUIRING NO REFRESH OPERATIONS

(75) Inventor: Yuji Kihara, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/247,349

(22) Filed: Sep. 20, 2002

(30) Foreign Application Priority Data

Apr. 4, 2002 (JP) ................................ 2002-102085

(51) Int. Cl.$^7$ ............................................... G11C 11/24
(52) U.S. Cl. ................... 365/149; 345/145; 345/189.09
(58) Field of Search .................................. 365/145, 149, 365/154, 189.09, 230.06, 203

(56) References Cited

U.S. PATENT DOCUMENTS

| | | | | |
|---|---|---|---|---|
| 5,311,470 A | * | 5/1994 | Atsumi et al. ......... | 365/185.07 |
| 5,428,571 A | * | 6/1995 | Atsumi et al. ......... | 365/189.05 |
| 5,671,174 A | * | 9/1997 | Koike et al. ................. | 365/145 |
| 5,943,256 A | * | 8/1999 | Shimizu et al. ............. | 365/145 |

FOREIGN PATENT DOCUMENTS

| | | |
|---|---|---|
| JP | 63-285794 | 11/1988 |
| JP | 3-34191 | 2/1991 |

* cited by examiner

*Primary Examiner*—David Nelms
*Assistant Examiner*—Gene N. Auduong
(74) *Attorney, Agent, or Firm*—McDermott, Will & Emery

(57) ABSTRACT

Two memory cells are provided for storage data of one bit, and stores data inverted from each other. Memory cells include charge compensating circuits, respectively, each being formed of an inverter, and charge compensating circuits include P-channel TFTs, respectively, which can be formed on bulk transistors. Charge compensating circuits are cross coupled, and latch data stored in memory cells. As a result, a semiconductor memory device can realize a higher packing density and a larger capacity without requiring refresh operations.

12 Claims, 8 Drawing Sheets

F I G. 1
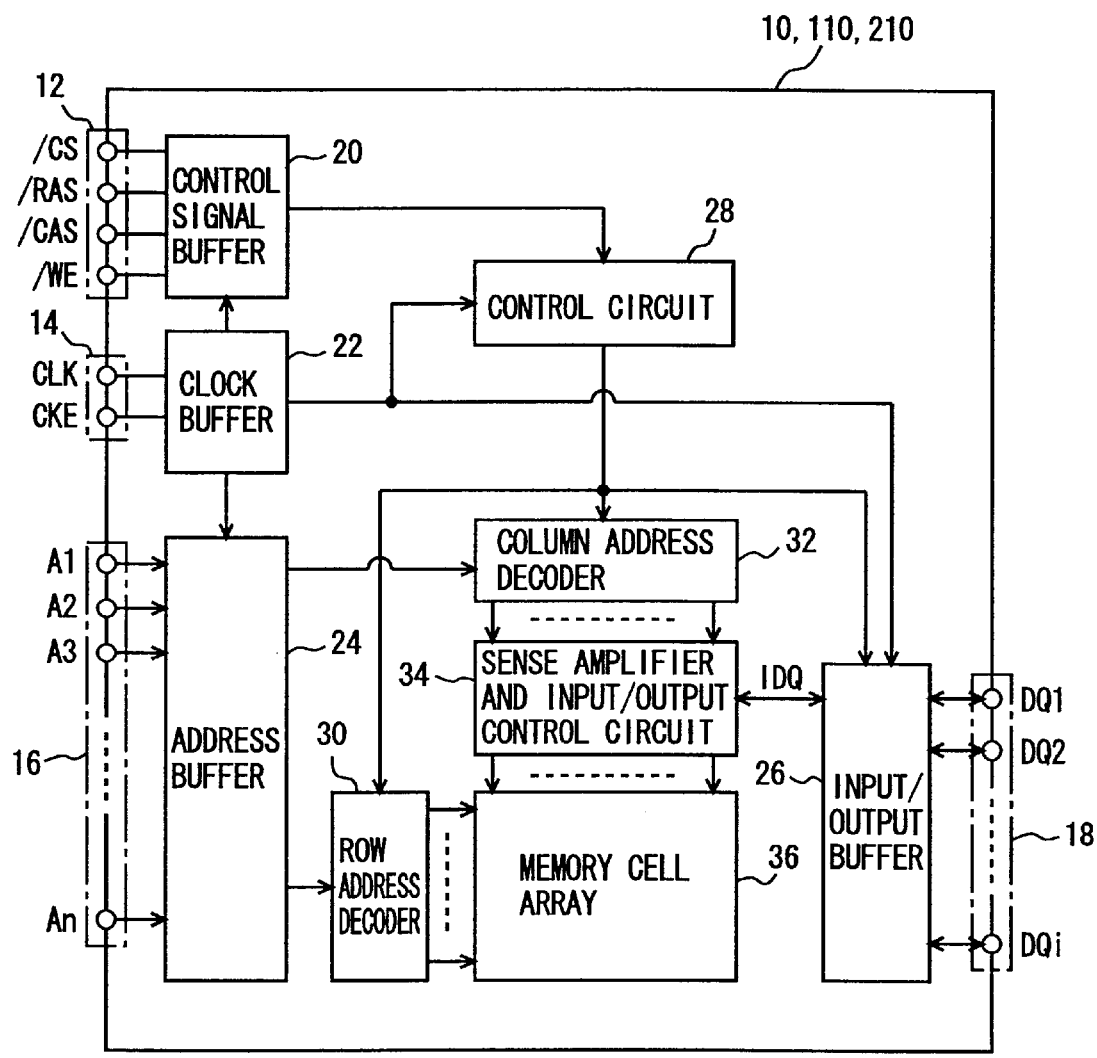

F I G. 2
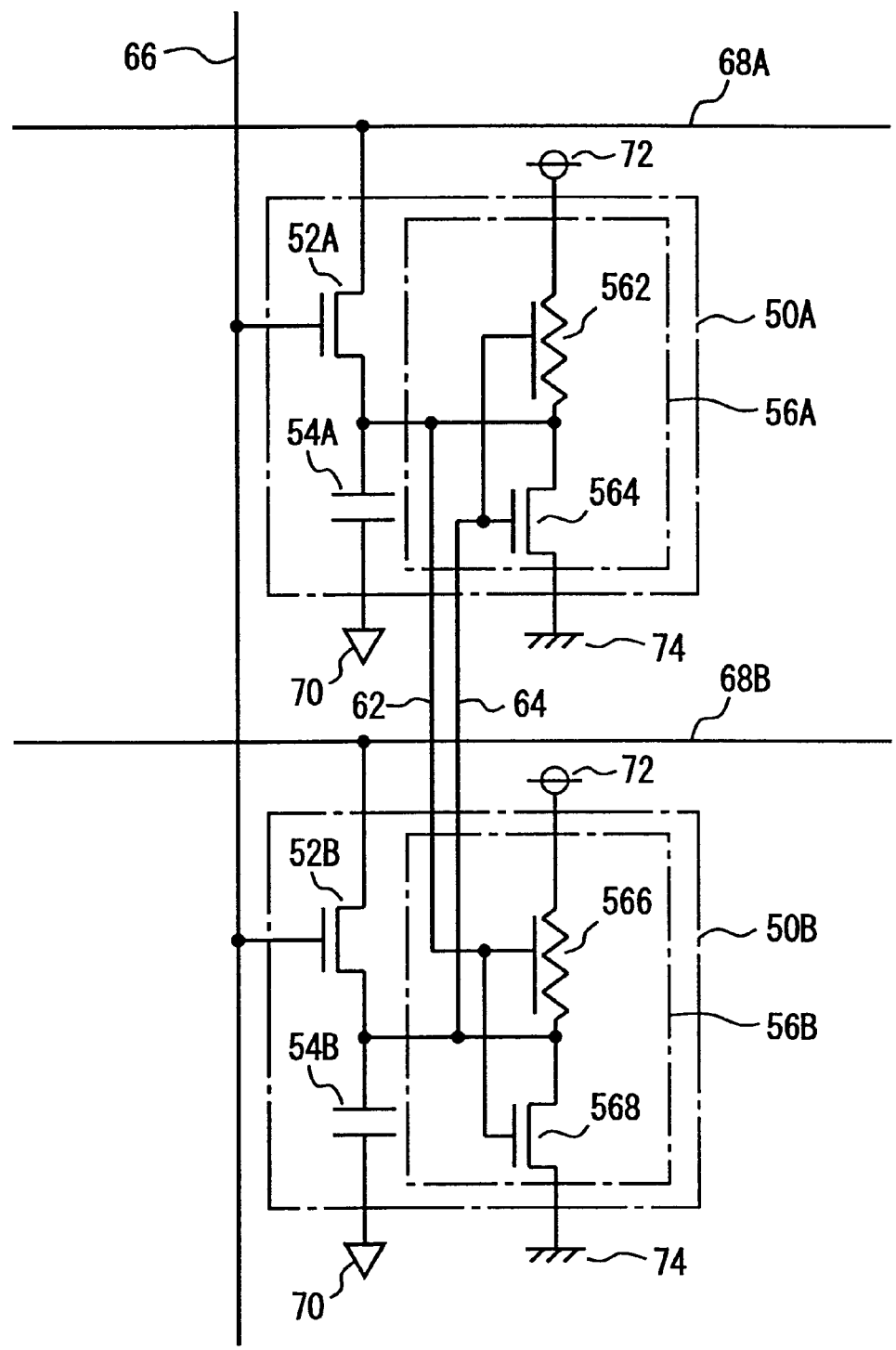

SEMICONDUCTOR MEMORY DEVICE HAVING MEMORY CELLS REQUIRING NO REFRESH OPERATIONS

BACKGROUND OF THE INVENTION

1. Field of the Invention

The present invention relates to a semiconductor memory device, and more particularly to a semiconductor memory device for storing information in accordance with the presence or absence of charges in a capacitor constituting of a memory cell.

2. Description of the Background Art

In a DRAM (Dynamic Random Access Memory) as a representative one of semiconductor memory devices, a memory cell is formed of one transistor and one capacitor, and the structure of a memory cell itself is simple. Consequently, the DRAM is regarded as a device which is optimum to realize higher packing density and larger capacity of a semiconductor device and used in various electronic devices.

FIG. 9 is a circuit diagram showing the configuration of one of memory cells arranged in a matrix on a memory cell array in a DRAM.

Referring to FIG. 9, a memory cell 500 is provided with an N-channel MOS transistor 502 and a capacitor 504. N-channel MOS transistor 502 is connected to a bit line 508 and capacitor 504 and has a gate connected to a word line 506. One end, which is different from an end connected to N-channel MOS transistor 502, of capacitor 504 is connected to a cell plate 510.

N-channel MOS transistor 502 is driven by word line 506 which is activated only when data is written or read, and is turned on only when data is written or read and is turned off at the other times.

Capacitor 504 stores binary information "1" or "0" in accordance with whether charges are accumulated or not. A voltage corresponding to the binary information "1" or "0" is applied to capacitor 504 via N-channel MOS transistor 502 from bit line 508, thereby charging or discharging capacitor 504 to write data.

Specifically, in the case of writing data "1", bit line 508 is precharged to a power supply voltage Vcc, and word line 506 is activated, thereby turning on N-channel MOS transistor 502. Power supply voltage Vcc is applied from bit line 508 to capacitor 504 via N-channel MOS transistor 502, and charges are accumulated in capacitor 504. The state where the charges are accumulated in capacitor 504 corresponds to data "1".

In the case of writing data "0", bit line 508 is precharged to a ground voltage GND and word line 506 is activated, thereby turning on N-channel MOS transistor 502. Charges are discharged from capacitor 504 to bit line 508 via N-channel MOS transistor 502. The state where charges are not accumulated in capacitor 504 corresponds to data "0".

On the other hand, at the time of reading data, bit line 508 is previously precharged to a voltage Vcc/2 and word line 506 is activated, thereby turning on N-channel MOS transistor 502, and bit line 508 and capacitor 504 are energized. It makes a very small voltage change according to a charge accumulating state of capacitor 504 appear on bit line 508, and a not-illustrated sense amplifier amplifies the very small voltage change to voltage Vcc or ground voltage GND. The voltage level of bit line 508 corresponds to the state of read data.

Since the above-described data reading operation is destructive reading, word line 506 is activated again in a state where bit line 508 is amplified to voltage Vcc or ground voltage GND in accordance with the read data, and capacitor 504 is recharged by an operation similar to the above-described data writing operation. By the operation, data once destroyed by the data reading operation recovers to the original state.

In a memory cell in the DRAM, charges in capacitor 504 corresponding to stored data leak due to various causes and are gradually lost. That is, stored data decays with time. Consequently, in the DRAM, before a voltage change in bit line 508 corresponding to stored data becomes undetectable in the data reading operation, a refresh operation of reading the data once and rewriting the data is executed.

In the DRAM, all of memory cells have to always periodically be subjected to the refresh operations. This point is the drawback of the DRAM since it is disadvantageous to realize higher speed and lower power consumption. The DRAM is inferior to an SRAM (Static Random Access Memory) which does not require refresh operations from the viewpoint of high speed and low power consumption. The DRAM, however, has a simple structure of a memory cell and can be formed at high packing density as described above. Consequently, the cost per bit is much lower as compared with other memory devices, so that the DRAM is in the mainstream of present RAMs.

On the other hand, an SRAM as also one of typical semiconductor memory devices is an RAM which does not require refresh operations indispensable for a DRAM.

FIG. 10 is a circuit diagram showing the configuration of one of memory cells arranged in a matrix on a memory cell array in a 6-transistors SRAM.

Referring to FIG. 10, a memory cell 700 is provided with N-channel MOS transistors 702 to 708, P-channel MOS transistors 710 and 712, and storage nodes 714 and 716.

Memory cell 700 has a configuration that a flip-flop obtained by cross-coupling an inverter formed of N-channel MOS transistor 702 and P-channel MOS transistor 710 and an inverter formed of N-channel MOS transistor 704 and P-channel MOS transistor 712 is connected to a pair of bit lines 718 and 720 via two N-channel MOS transistors 706 and 708 as transfer gates.

In memory cell 700, states of voltage levels of storage nodes 714 and 716 correspond to stored data. For example, the state where storage nodes 714 and 716 are at the H and L levels, respectively, corresponds to stored data "1", and the state where storage nodes 714 and 716 are at the L and H levels, respectively, corresponds to stored data "0". Data on cross-coupled storage nodes 714 and 716 is in a bi-stable state which is maintained as long as a predetermined power supply voltage is supplied. With respect to this point, the SRAM is fundamentally different from a DRAM in which charges accumulated in the capacitor dissipate with time.

In memory cell 700, in data writing operation, voltages at opposite levels corresponding to write data are applied to the pair of bit lines 718 and 720, and word line 722 is activated to turn on transfer gates 706 and 708, thereby setting the state of the flip flop. On the other hand, data reading operation is performed in such a manner that word line 722 is activated to turn on transfer gates 706 and 708, potentials on storage nodes 714 and 716 are transmitted to bit lines 718 and 720, and a voltage change in bit lines 718 and 720 at this time is detected.

Memory cell 700 is formed of six bulk transistors. There is also an SRAM having a memory cell which can be formed of four bulk transistors.

FIG. 11 is a circuit diagram showing the configuration of one of memory cells arranged in a matrix on a memory cell array in a 4-transistors SRAM.

Referring to FIG. 11, a memory cell 750 is provided with, in place of P-channel MOS transistors 710 and 712 in memory cell 700, P-channel thin film transistors (hereinafter, referred to as "P-channel TFT") 730 and 732. As P-channel TFTs 730 and 732, resistors of high resistance may be used. "4-transistors" in the name of the 4-transistors SRAM denotes that one memory cell has four bulk transistors. "Bulk" means that a transistor is formed in a silicon substrate in contrast to the meaning that a TFT is formed on a substrate. In the following, a transistor formed in a silicon substrate will be referred to as a "bulk transistor" in contrast to thin film devices such as TFT formed on a substrate.

Since the operation principle of memory cell 750 is basically the same as that of memory cell 700, its description will not be repeated.

P-channel TFTs 730 and 732 are formed on upper layers of N-channel MOS transistors 702 and 704, so that the 4-transistors SRAM has an advantage such that its cell area is made smaller than that of a 6-transistors SRAM. On the other hand, the 4-transistors SRAM has a low-voltage characteristic inferior to that of the 6-transistors SRAM. Therefore, the 4-transistors SRAM cannot cope with the tendency of lower voltage required for semiconductor memory devices of recent years and is not used so much at present.

As described above, a single-memory-cell DRAM which is in the mainstream at present has a simple memory cell structure and is therefore suitable for realizing higher packing density and larger capacity but requires refresh operations.

In a conventional DRAM, at the time of reading data, to perfectly transmit the state of charges held in the capacitor of a memory cell to a bit line, the voltage of a word line for driving an access transistor has to be boosted from a power supply voltage, so that the potential of the capacitor after the data reading operation becomes close to a precharge voltage ½ Vcc of the bit line. Therefore, data is read and simultaneously destroyed, and an operation of re-writing the data is necessary after the reading operation.

On the other hand, an SRAM does not require refresh operations but needs six or four bulk transistors. In the SRAM, to stabilize its operation, in FIGS. 10 and 11, a current driving capability ratio (referred to as a cell ratio) between N-channel MOS transistors 702 and 704 called driver transistors and N-channel MOS transistors 706 and 708 called access transistors has to be set to 2 or 3 or even higher. It is consequently necessary to design that the gate width of the driver transistors is large. Therefore, a memory cell in the SRAM becomes larger and cannot achieve higher packing density and larger capacity.

As described above, the characteristics and structures of conventional DRAM and SRAM have advantages and disadvantages.

However, in future, in association with further development of IT, expectations on semiconductor memory devices satisfying higher performance (higher speed and lower power consumption), higher packing density, and larger capacity are high.

SUMMARY OF THE INVENTION

The present invention has been achieved to solve the problems and an object thereof is to provide a semiconductor memory device having memory cells realizing a higher packing density and a larger capacity without requiring refresh operations.

Another object of the present invention is to provide a semiconductor memory device having memory cells which require no refresh operations and access stored data at a higher speed and whose operating speed is further increased.

Further another object of the present invention is to provide a semiconductor memory device having memory cells which require no refresh operations and can read stored data non-destructively, and whose operating speed is further increased.

According to the invention, a semiconductor memory device is provided with: a memory cell array including a plurality of memory cells arranged in a matrix; and a plurality of word lines and a plurality pairs of bit lines arranged, respectively, in correspondence with rows and columns of the memory cells, wherein each of the plurality of memory cells includes: a first memory cell for storing data of one bit of stored information expressed by binary information; and a second memory cell for storing inversion data obtained by inverting the data, the first memory cell includes a first capacitive element for holding charges according to a logic level of the data, a first access transistor driven by a voltage applied to the word line, for transferring charges between one bit line of the pair of bit lines and the first capacitive element, and a first charge compensating circuit for compensating charges leaked from the first capacitive element, and the second memory cell includes a second capacitive element for holding charges according to a logic level of the inversion data, a second access transistor driven by the voltage applied to the word line, for transferring charges between the other bit line of the pair of bit lines and the second capacitive element, and a second charge compensating circuit for compensating charges leaked from the second capacitive element.

In the semiconductor memory device according to the present invention, each of the plurality of memory cells includes the first and second memory cells for storing data inverted from each other, the first memory cell includes the first charge compensating circuit for compensating charges leaked from the first capacitive element, and the second memory cell includes the second charge compensating circuit for compensating charges leaked from the second capacitive element.

Therefore, according to the present invention, dissipation of stored data due to leakage of charges can be prevented without performing refresh operations.

Preferably, the first and second charge compensating circuits is formed of first and second inverters, respectively, an output node of the first charge compensating circuit is connected to a first storage node for connecting the first capacitive element to the first access transistor, an input node of the first charge compensating circuit is connected to a second storage node for connecting the second capacitive element to the second access transistor, an output node of the second charge compensating circuit is connected to the second storage node, and an input node of the second charge compensating circuit is connected to the first storage node.

The first and second charge compensating circuits is formed of first and second inverters, respectively, which are cross coupled.

Therefore, according to the present invention, the latch function is constructed by the first and second inverters, and stored information can be stably held in the first and second storage nodes.

According to the present invention, a semiconductor memory device is provided with: a memory cell array including a plurality of memory cells arranged in a matrix; a plurality of word lines and a plurality of bit lines disposed, respectively, in correspondence with rows and columns of the memory cells; and a plurality internal signal lines disposed in correspondence with rows of the memory cells. Each of the plurality of memory cells includes: a capacitive element for holding charges according to a logic level of data of one bit of storage information expressed by binary information; a first transistor driven by a voltage applied to the word line, for transferring the charges between the bit line and the capacitive element; a charge compensating circuit for compensating charges leaked from the capacitive element in accordance with a logic level of the data; and a second transistor connected between a storage node for connecting the capacitive element to the first transistor and the charge compensating circuit, and the second transistor is driven by a voltage applied to the internal signal line to disconnect the charge compensating circuit from the storage node at the time of reading the data.

In the semiconductor memory device according to the present invention, each of the plurality of memory cells includes: the charge compensating circuit for compensating charges leaked from the capacitive element for holding charges corresponding to the logic level of the stored information, and the second transistor connected between the storage node for connecting the capacitive element to an access transistor and the charge compensating circuit, for disconnecting the charge compensating circuit from the storage node at the time of reading data.

Therefore, according to the present invention, without performing refresh operations, dissipation of stored information due to leakage of charges can be prevented, and further, data can be read non-destructively.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic block diagram showing a general configuration of a semiconductor memory device according to the present invention;

FIG. 2 is a circuit diagram showing the configuration of memory cells arranged in a matrix on a memory cell array in a semiconductor memory device according to a first embodiment;

DESCRIPTION OF THE PREFERRED EMBODIMENTS

Figure 3:
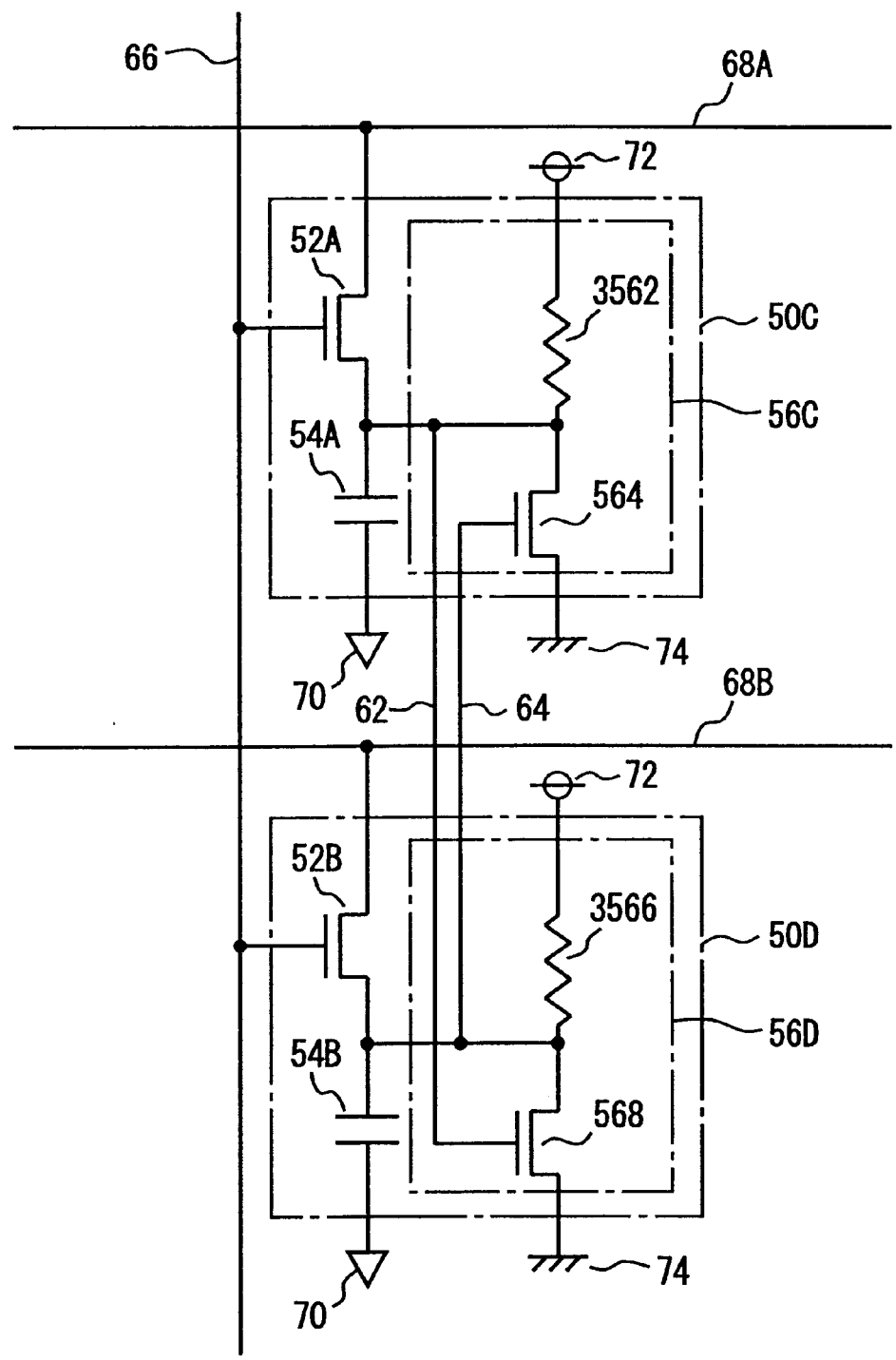
FIG. 3 is a circuit diagram showing another configuration of memory cells arranged in a matrix on the memory cell array in the semiconductor memory device according to the first embodiment.

Embodiments of the invention will be described in detail hereinafter with reference to the drawings. The same or corresponding parts in the diagrams are designated by the same reference numeral and its description will not be repeated.

First Embodiment

FIG. 1 is a schematic block diagram showing a general configuration of a semiconductor memory device according to a first embodiment of the present invention.

Referring to FIG. 1, a semiconductor memory device 10 is provided with a control signal terminal 12, a clock terminal 14, an address terminal 16, and a data input/output terminal 18. Semiconductor memory device 10 is also provided with a control signal buffer 20, a clock buffer 22, an address buffer 24, and an input/output buffer 26. Further, semiconductor memory device 10 is provided with a control circuit 28, a row address decoder 30, a column address decoder 32, a sense amplifier and input/output control circuit 34, and a memory cell array 36.

In FIG. 1, only main components related to data inputs and outputs of semiconductor memory device 10 are representatively shown.

Control signal terminal 12 receives command control signals of a chip select signal /CS, a row address strobe signal /RAS, a column address strobe signal /CAS, and a write enable signal /WE. Clock terminal 14 receives an external clock CLK and a clock enable signal CKE. Address terminal 16 receives address signals A0 to An (n is a natural number).

Clock buffer 22 receives external clock CLK, generates an internal clock, and outputs the internal clock to control signal buffer 20, address buffer 24, input/output buffer 26, and control circuit 28. Control signal buffer 20 takes in and latches, synchronously with the internal clock received from clock buffer 22, chip select signal /CS, row address strobe signal /RAS, column address strobe signal /CAS, and write enable signal /WE and outputs them to control circuit 28. Address buffer 24 takes in and latches address signals A0 to An synchronously with the internal clock received from clock buffer 22, generates an internal address signal, and outputs the internal address signal to row address decoder 30 and column address decoder 32.

Data input/output terminal 18 is a terminal to/from which data to be read/written from/to semiconductor memory device 10 is transmitted/received to/from the outside. Data input/output terminal 18 receives data DQ0 to DQi (i denotes a natural number) entered from the outside in data writing operation and outputs data DQ0 to DQi to the outside in data reading operation.

Input/output buffer 26 takes in and latches data DQ0 to DQi synchronously with the internal clock received from clock buffer 22, and outputs internal data IDQ to sense amplifier and input/output control circuit 34. On the other hand, input/output buffer 26 outputs internal data IDQ received from sense amplifier and input/output control circuit 34 to data input/output terminal 18 synchronously with the internal clock received from clock buffer 22.

Control circuit 28 takes in the command control signal from control signal buffer 20 synchronously with the internal clock received from clock buffer 22, and controls row address decoder 30, column address decoder 32, and input/output buffer 26 on the basis of the taken in command control signal. By the control, data DQ0 to DQi is read/written from/to memory cell array 36.

Row address decoder 30 selects a word line on memory cell array 36 corresponding to address signals A0 to An on the basis of the instruction from control circuit 28, and activates a word line selected by a not-illustrated word driver. Column address decoder 32 selects a bit line pair on memory cell array 36 corresponding to address signals A0 to An on the basis of the instruction from control circuit 28.

In data writing operation, sense amplifier and input/output control circuit 34 precharges the bit line pair selected by column address decoder 32 to power supply voltage Vcc or ground voltage GND in accordance with the logic level of internal data IDQ received from input/output buffer 26. Consequently, internal data IDQ is written into a memory cell in memory cell array 36 connected to the word line activated by row address decoder 30 and the bit line pair selected by column address decoder 32 and precharged by sense amplifier and input/output control circuit 34.

On the other hand, in the data reading operation, sense amplifier and input/output control circuit 34 precharges the bit line pair selected by column address decoder 32 to voltage Vcc/2 before the data reading operation, detects and amplifies a very small voltage change which generates in correspondence with read data in the selected bit line pair, determines the logic level of the read data, and outputs the resultant to input/output buffer 26.

Memory cell array 36 is a memory element group in which memory cells to be described later are arranged in a matrix, connected to row address decoder 30 via word lines corresponding to the rows, and connected to sense amplifier and input/output control circuit 34 via bit line pairs corresponding the columns.

FIG. 2 is a circuit diagram showing the configuration of memory cells arranged in a matrix on memory cell array 36 in semiconductor memory device 10.

Referring to FIG. 2, memory cells in semiconductor memory device 10 have a twin memory cell configuration in which two memory cells 50A and 50B for storing 1-bit data and data obtained by inverting the 1-bit data, respectively, are assigned. Memory cell 50A has an N-channel MOS transistor 52A, a capacitor 54A, and a charge compensating circuit 56A, and memory cell 50B has an N-channel MOS transistor 52B, a capacitor 54B, and a charge compensating circuit 56B.

N-channel MOS transistor 52A is connected to one (68A) of a pair of bit lines 68A and 68B and capacitor 54A and has a gate connected to a word line 66. N-channel MOS transistor 52A is driven by word line 66 which is activated only when data is written or read, is turned on only when data is written or read, and is turned off at other times.

Capacitor 54A stores binary information "1" or "0" in accordance with whether charges are accumulated or not. One end of capacitor 54A is connected to N-channel MOS transistor 52A, and other end is connected to a cell plate 70. By applying a voltage corresponding to binary information "1" or "0" from bit line 68A to capacitor 54A via N-channel MOS transistor 52A, capacitor 54A is charged/discharged, and data is written.

Charge compensating circuit 56A is formed of an inverter consisting of a P-channel TFT 562 and an N-channel MOS transistor 564, and an input node and an output node of the inverter are connected to nodes 64 and 62, respectively.

N-channel MOS transistor 52B is connected to the other bit line (68B) in the pair of bit lines 68A and 68B and capacitor 54B, and has a gate connected to word line 66. N-channel MOS transistor 52B is driven by word line 66 shared with N-channel MOS transistor 52A, is turned on when data is written or read and is turned off at other times.

Capacitor 54B stores binary information "1" or "0" according to whether charges are accumulated or not. One end of capacitor 54B is connected to N-channel MOS transistor 52B, and the other end is connected to cell plate 70. By applying the voltage corresponding to the binary information "1" or "0" from bit line 68B to capacitor 54B via N-channel MOS transistor 52B, capacitor 54B is charged/discharged, and data is written. Capacitor 54B stores data obtained by inverting data stored in capacitor 54A.

Charge compensating circuit 56B is formed of an inverter consisting of a P-channel TFT 566 and an N-channel MOS transistor 568. An input node and an output node of the inverter are connected to nodes 62 and 64, respectively.

The configuration of N-channel MOS transistor 52A and capacitor 54A and that of N-channel MOS transistor 52B and capacitor 54B are the same as that of a general DRAM.

Each of P-channel TFTs 562 and 566 is a resistive element having a switching function made of polycrystalline polysilicon, which is a high-resistive element having an OFF-state resistance of T ("tera" indicates $10^{12}$) $\Omega$ order and an ON-state resistance of G ("giga" indicates $10^9$) $\Omega$ order.

In the present invention, a resistive element denotes both a resistive element having a switching function and a resistive element of constant resistance.

P-channel TFT 562 is connected to a power supply node 72 and node 62 and has a gate connected to node 64. N-channel MOS transistor 564 is connected to node 62 and a ground node 74 and has a gate connected to node 64.

P-channel TFT 566 is connected to power supply node 72 and node 64 and has a gate connected to node 62. N-channel MOS transistor 568 is connected to node 64 and ground node 74 and has a gate connected to node 62.

In a memory cell of semiconductor memory device 10, by the latch function realized by the inverter formed of P-channel TFT 562 and N-channel MOS transistor 564 and the inverter formed of P-channel TFT 566 and N-channel MOS transistor 568, a leak current of capacitors 54A and 54B for holding data and data obtained by inverting the data is compensated, so that stored data is held without performing a refresh operation.

The operations of a memory cell in semiconductor memory device 10 will be described hereinafter.

(1) Writing of data

In memory cells 50A and 50B, an ON-state current of a bulk transistor is approximately $3\times10^{-5}$ A (ampere) and an ON-state current and an OFF-state current of a TFT are approximately $1\times10^{-11}$ A and $1\times10^{-13}$ A, respectively. A leak current from nodes 62 and 64 due to the OFF-state current of the bulk transistor is approximately $1\times10^{-15}$ A. The current values shown here are not limited to those numerical values which are shown as degrees.

With the above-described current values, the ON-state current of each of P-channel TFTs 562 and 566 is higher than the leak current from each of nodes 62 and 64 by four digits. Consequently, nodes 62 and 64 can be charged to the power supply voltage from power supply node 72.

When data "0" is written into memory cell 50A, the voltage at node 62 becomes 0V. Only by 0V at node 62, node 64 is not charged to the power supply voltage from power supply node 72 at the order of n (nano indicating $10^{-9}$) as usual write operation time as shown by the following equation.

In the case where the power supply voltage of power supply node 72 is 2V, and the capacity of node 64 is a several fF (femto farad, "femto" indicating $10^{-15}$), for example, 5 fF, the following equation is satisfied at node 64.

Charge $Q$=Capacity $C\times$Voltage $V=5f\times2=1\times10^{-14}$

ON-state current $I$ of $P$-channel TFT $582=1\times10^{-11}$ ampere

Charging time $t=Q/I=1\times10^{-3}$ seconds  (1)

Therefore, only by changing the voltage at node 62 to 0V, it takes time of the order of $\mu$ ("micro" indicating $10^{-6}$) to the order of m (milli) seconds. Consequently, even when the voltage of node 62 becomes 0V, node 64 is not immediately charged, and node 62 is re-charged via P-channel TFT 562.

In the memory cell in semiconductor memory device 10, however, data "1" is written in memory cell 50B at the same time data "0" is written to memory cell 50A, and node 64 is immediately charged to the power supply voltage at the writing operation time of the order of n (nano) seconds from bit line 68B via N-channel MOS transistor 52B. Consequently, N-channel MOS transistor 564 is immediately turned on and node 62 is thereby held at 0V. Node 62 immediately becomes 0V and the state is maintained. Accordingly, N-channel MOS transistor 568 is turned off and the state is maintained, so that node 64 is maintained at the power supply voltage.

In such a manner, the voltages at nodes 62 and 64 become 0V and the power supply voltage in correspondence with data "0" and "1" written in memory cells 50A and 50B, respectively. The voltage states are latched by interlocking operation of charge compensating circuits 56A and 56B. After that, without performing a refresh operation, the state of written data is held.

Since memory cells 50A and 50B have the same circuit configuration, when data "1" is written in memory cell 50A and data "0" is accordingly written in memory cell 50B, only the operations of memory cells 50A and 50B are interchanged and operations similar to the above-described operations are performed. The description will not be therefore repeated.

(2) Reading of data

With respect to reading of data from a memory cell in semiconductor memory device 10, in memory cells 50A and 50B, it is performed by the same operations as those in a general DRAM. Specifically, bit lines 68A and 68B are precharged to voltage Vcc/2 and, at the time of reading data, a boosted power supply voltage is applied to word line 66 to make word line 66 active. By the operation, N-channel MOS transistors 52A and 52B in memory cells 50A and 50B are turned on and small voltage changes appearing on bit lines 68A and 68B in accordance with the accumulating states of capacitors 54A and 54B are compared with each other by a not-illustrated sense amplifier. According to the direction of the voltage change from precharge voltage ½ Vcc, the voltage on each of bit lines 68A and 68B as a pair is amplified to voltage Vcc or ground voltage GND. The voltage level of bit line 68A corresponds to the state of stored data.

In semiconductor memory device 10 having the configuration of a twin memory cell, as compared with a semiconductor memory device of a single memory cell, data can be read at higher speed for the following reason. In a semiconductor memory device of a single memory cell, the voltage on the bit line is compared with precharge voltage ½ Vcc. In contrast, in semiconductor memory device 10, data and data obtained by inverting the data are stored in memory cells 50A and 50B. Consequently, at the time of reading data, the voltages on bit lines 68A and 68B slightly change in opposite directions from precharge voltage ½ Vcc and a potential difference between bit lines 68A and 68B is directly compared by a sense amplifier. Therefore, in semiconductor memory device 10, data is detected by the sense amplifier at an amplitude twice as large as that in the semiconductor memory device of a single memory cell, so that data is read from a memory cell at high speed.

After data is read, in a state where each of the voltages on bit lines 68A and 68B is amplified to voltage Vcc or ground voltage GND, word line 66 is activated again, and capacitors 54A and 54B are re-charged via N-channel MOS transistors 52A and 52B, respectively. In a manner similar to the above operations (1), data is rewritten.

In semiconductor memory device 10, as the voltage applied to word line 66 at the time of reading data, not a voltage obtained by boosting the power supply voltage but a voltage which is equal to or lower than the power supply voltage can be used.

When a voltage obtained by boosting the power supply voltage is used as a voltage applied to word line 66, data stored in memory cells 50A and 50B is destroyed in a data reading operation, and data has to be rewritten for the following reason. The potential of node 62 after data is read is determined by the capacity of bit line 68A and the capacity of capacitor 54A. The potential of node 64 after data is read is determined by the capacity of bit line 68B and the capacity of capacitor 54B. Since the capacity of the pair of bit lines 68A and 68B is at least ten times as large as that of capacitors 54A and 54B, the potential of nodes 62 and 64 after data is read becomes close to the potential of the pair of bit lines 68A and 68B more than the potential before data is read.

However, the memory cell in semiconductor memory device 10 has, different from a general DRAM, charge compensating circuits 56A and 56B. Charge compensating circuits 56A and 56B include N-channel MOS transistor 564 connected to node 62 and N-channel MOS transistor 568 connected to node 64, respectively. By the action of N-channel MOS transistors 564 and 568, the voltage to be applied to word line 66 can be set to the power supply voltage or lower without boosting the voltage of word line 66. The reason will be described hereinafter.

When data "0" and "1" is stored in memory cells 50A and 50B, respectively, N-channel MOS transistors 564 and 568 are turned ON and OFF, respectively. N-channel MOS transistor 564 pulls charges from node 62, and N-channel MOS transistor 568 does not pull charges from node 64.

On the other hand, when data "1" and "0" is stored in memory cells 50A and 50B, respectively, N-channel MOS transistors 564 and 568 are turned OFF and ON, respectively. N-channel MOS transistor 564 does not pull charges from node 62, and N-channel MOS transistor 568 pulls charges from node 64.

Therefore, charge compensating circuits 56A and 56B have also the function of either pulling charges at nodes 62 and 64 by N-channel MOS transistors 564 and 568 or not at the time of reading data. The function enables data to be read without completely transmitting the state of charges in capacitors 54A and 54B to bit lines 68A and 68B, respectively.

The case where data "0" and "1" is stored in memory cells 50A and 50B, respectively, and is read will be described hereinbelow. With respect to the case where data "1" and "0" is stored in memory cells 50A and 50B, respectively, the operations of memory cells 50A and 50B are only interchanged, so that the description in this case will not be repeated.

At the time of reading data, in memory cell 50A, charges flowing in from bit line 68A via N-channel MOS transistor 52A are pulled by N-channel MOS transistor 564. Consequently, even if the voltage of word line 66 is not boosted, the voltage of bit line 68A drops from precharge voltage ½ Vcc to an extent that data "0" can be detected. On the other hand, a voltage change in node 62 is suppressed to a small range from 0V since N-channel MOS transistor 564 pulls charges on node 62.

On the other hand, in memory cell 50B, a voltage change on node 62 is suppressed in a small range from 0V due to an effect of pull-out of charges on node 62 by N-channel MOS transistor 564. Consequently, N-channel MOS transistor 568 maintains an OFF state and does not pull charges from node 64. Since charges flowing out from node 64 to bit line 68B via N-channel MOS transistor 52B are compensated by P-channel TFT 566, even if the voltage on word line 66 is not boosted, the voltage on bit line 68B increases from precharge voltage ½ Vcc to an extent that data "1" can be detected.

Since the ON-state current of P-channel TFT 566 is lower than the ON-state current of N-channel MOS transistor 52B, immediately after N-channel MOS transistor 52B is turned on, the voltage at node 64 drops to a value close to precharge voltage ½ Vcc. However, power supply voltage Vcc is 2V and a logic threshold voltage (input voltage when the output voltage sharply changes) of an inverter as a component of charge compensating circuit 56A is designed to approximately 0.3V. Therefore, N-channel MOS transistor 564 in memory cell 50A is not turned off. After the data reading operation is finished and N-channel MOS transistor 52B is turned off, charges on node 64 are compensated by P-channel TFT 566, so that the voltage on node 64 recovers to power supply voltage Vcc.

As described above, even if the voltage on word line 66 is not boosted, data can be read from memory cells 50A and 50B. Without destroying the state of data stored in memory cells 50A and 50B, data can be read onto bit lines 68A and 68B.

In such a manner, data is read/written from/to a memory cell in semiconductor memory device 10, and data can be read non-destructively without boosting the voltage on word line 66.

It is sufficient to determine the lower limit of a voltage applied to word line 66 so that, in relation to the cell ratio which will be described hereinafter, the current driving capability of N-channel MOS transistors 52A and 52B as access transistors becomes equal to or higher than the half of the current driving capability of N-channel MOS transistors 564 and 568 as driver transistors (the cell ratio is 2 or lower).

The reason why P-channel TFTs 562 and 566 are used for memory cells 50A and 50B is that P-channel TFTs 562 and 566 can be formed on N-channel MOS transistors 564 and 568, and increase in the cell area due to usage of a twin memory cell can be suppressed. Consequently, the number of bulk transistors per bit becomes four, and the cell area becomes smaller as compared with a standard SRAM constructed by six bulk transistors.

Further, as one of features of memory cells 50A and 50B, the cell ratio can be set to a value close to 1 (ratioless).

Figure 10:
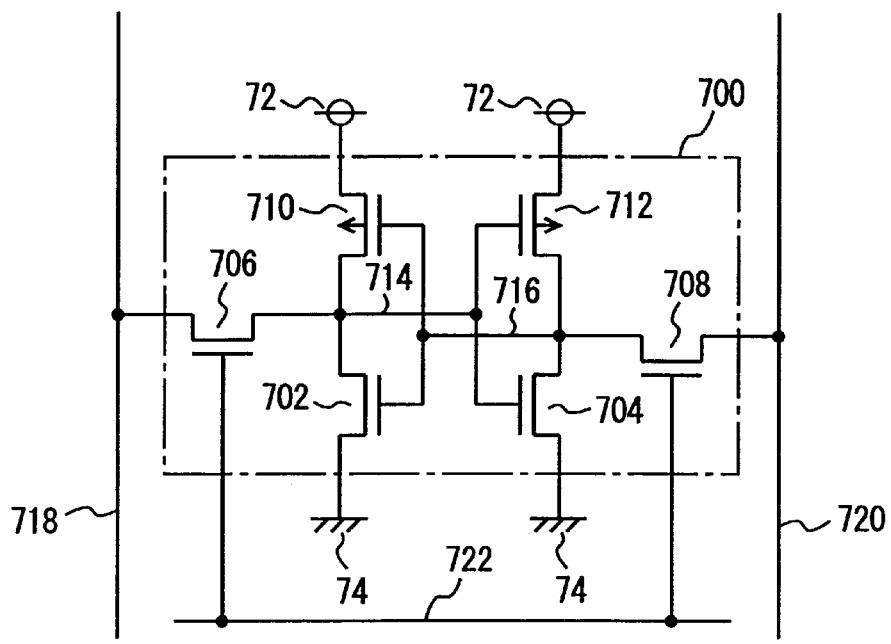
FIG. 10 is a circuit diagram showing the configuration of one of memory cells arranged in a matrix on a memory cell array in a 6-transistor SRAM.
Figure 11:
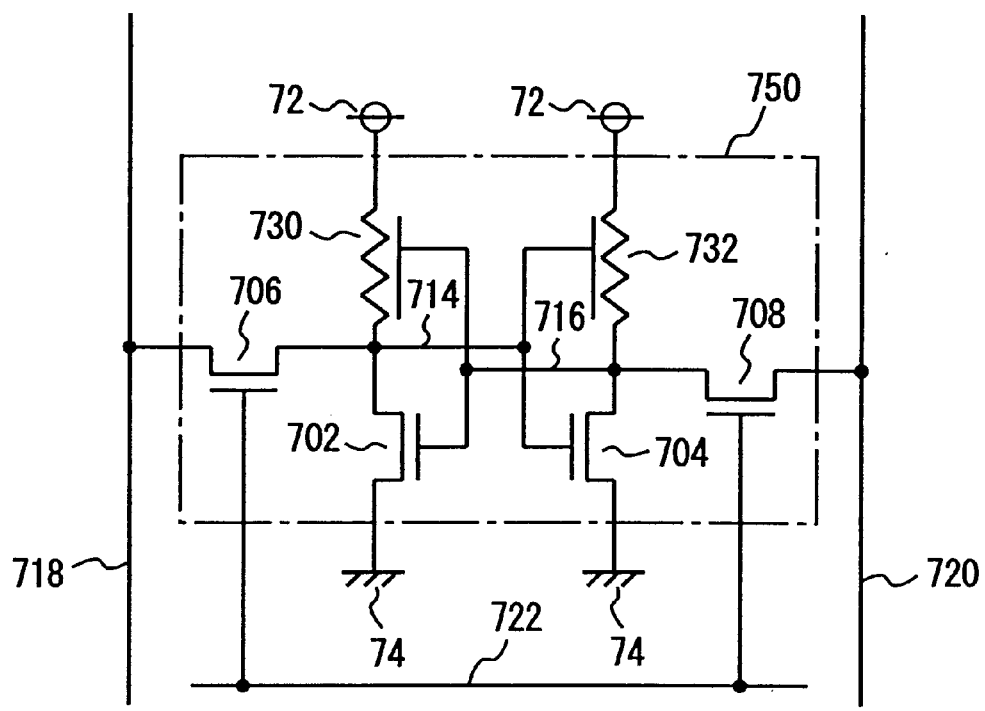
FIG. 11 is a circuit diagram showing the configuration of one of memory cells arranged in a matrix on a memory cell array in a 4-transistor SRAM.

The cell ratio denotes a current driving capability ratio between the driver transistors in memory cells (N-channel MOS transistors 702 and 704 in memory cells 700 and 750 of the SRAM shown in FIGS. 10 and 11 and N-channel MOS transistors 564 and 568 in memory cells 50A and 50B shown in FIG. 2) and access transistors (N-channel MOS transistors 706 and 708 in memory cells 700 and 750 in the SRAM shown in FIGS. 10 and 11 and N-channel MOS transistors 52A and 52B in memory cells 50A and 50B shown in FIG. 2). Generally, in an SRAM, to stabilize the operation of a memory cell, the cell ratio is set to 2 or 3 or higher. This means that the gate width of a driver transistor is set to be larger than that of an access transistor to assure a predetermined cell ratio in an SRAM.

On the other hand, in memory cells 50A and 50B, capacitors 54A and 54B connected to nodes 62 and 64, respectively, are provided. Consequently, the ability of access transistors 52A and 52B to drive nodes 62 and 64 is suppressed by capacitors 54A and 54B. That is, even driver transistors 564 and 568 and access transistors 52A and 52B are set to a ratioless, an effect equivalent to that in the case where a predetermined cell ratio is provided can be obtained by capacitors 54A and 54B. Therefore, unlike a conventional SRAM, it is unnecessary to set the gate width of the driver transistor to be larger than that of the access transistor in order to assure the predetermined cell ratio, so that reduction in the cell area can be achieved.

When the stability of the operation of a memory cell is considered, in memory cells 50A and 50B, it is unnecessary to set a cell ratio equivalent to that of the SRAM. However, in order to further increase stability of operation, it is desirable to set some cell ratio.

Although the configuration using TFTs in charge compensating circuits 56A and 56B has been described above, a memory cell producing a similar effect can be also realized by using a resistor of high resistance in place of the TFTs.

FIG. 3 is a circuit diagram showing a circuit configuration of memory cells 50C and 50D having charge compensating circuits 56C and 56D including resistors 3562 and 3566 of high resistance in place of P-channel TFTs 562 and 566 in memory cells 50A and 50B in FIG. 2, respectively. Since the circuit configurations of memory cells 50C and 50D are similar to those of memory cells 50A and 50B except for resistors 3582 and 3602 of high resistance, respectively, their description will not be repeated.

In the following, the state where data "0" and "1" is written in memory cells 50C and 50D, respectively will be described. Since the state where data "1" and "0" is written in memory cells 50C and 50D, respectively is similar to the above, its description will not be repeated.

Referring to FIG. 3, in a state where data "0" and "1" is written in memory cells 50C and 50D, respectively, the voltage at node 62 is 0V and the voltage at node 64 is power supply voltage Vcc. In memory cell 50C, a current is always passed from power supply node 72 through resistor 3562 of high resistance and N-channel MOS transistor 564. If a resistor of a high resistance value is not used as resistor 3562 of high resistance, a current in a standby period in which data reading/writing operation is not performed (hereinafter, referred to as a standby current) increases.

On the other hand, if the resistance value of resistor 3566 of high resistance is too high, a leak current from N-channel MOS transistor 568 cannot be ignored at node 64 and the potential at node 64 decreases.

Therefore, it is necessary to supply a current which is, at least, ten times as high as the leak current from resistor 3566 of high resistance in order to stabilize the state of node 64. When it is assumed that power supply voltage is 2V and the leak current is $1 \times 10^{-15}$ A, to pass a current $1 \times 10^{-14}$ which is ten times as high as the leak current to resistor 3566 of high resistance, the resistance value of resistor 3566 of high resistance is sufficiently $2 \times 10^{-14}$ Ω (ohm) or less.

In the case where data "1" and "0" is written in memory cells 50C and 50D, respectively, the above description can be also applied to resistor 3562 of high resistance.

On the other hand, the lower limit of the resistance values of resistors 3562 and 3566 of high resistance is determined according to the specifications of memory capacity of semiconductor memory device 10 on which memory cells 50C and 50D are mounted and the standby current. For example, when the memory capacity is 4 M (mega, "M" indicating $10^6$) bits, to suppress the standby current to 10 μA, a current I flowing through the resistor of high resistance per memory cell is obtained as follows. I=$(10 \times 10^{-6}$ A$)/(4 \times 10^6$ bits$)=2.5 \times 10^{-12}$ A. Therefore, since the power supply voltage is 2V, the resistance value of resistors 3562 and 3566 of high resistance is obtained by R=$2V/(2.5 \times 10^{-12}$ A$)=8 \times 10^{11}$ Ω. From the above, under the above condition, the resistance value of resistors 3562 and 3566 of high resistance may be in a range from $8 \times 10^{11}$ Ω to $2 \times 10^{14}$ Ω.

As described above, semiconductor memory device 10 according to the first embodiment has the twin memory cell constructed by memory cells 50A and 50B including charge compensating circuits 56A and 56B. Consequently, unlike a conventional DRAM, refresh operations are unnecessary, data can be read at high speed, and a memory cell from which data can be non-destructively read can be realized.

In semiconductor memory device 10 according to the first embodiment, a TFT or a resistor of high resistance is used for a part of charge compensating circuits 56A and 56B and, further, the cell ratio of the driver transistor and the access transistor is set to ratioless, a memory cell of which cell area is reduced as compared with a conventional SRAM can be realized.

Second Embodiment

A semiconductor memory device 110 according to a second embodiment is provided with memory cells which are similar to memory cells 50A and 50B in semiconductor memory device 10 according to the first embodiment except that N-channel MOS transistors 564 and 568 in charge compensating circuits 56A and 56B are not included.

The general configuration of semiconductor memory device 110 according to the second embodiment is the same as that of semiconductor memory device 10 according to the first embodiment shown in FIG. 1, so that its description will not be repeated.

Figure 4:
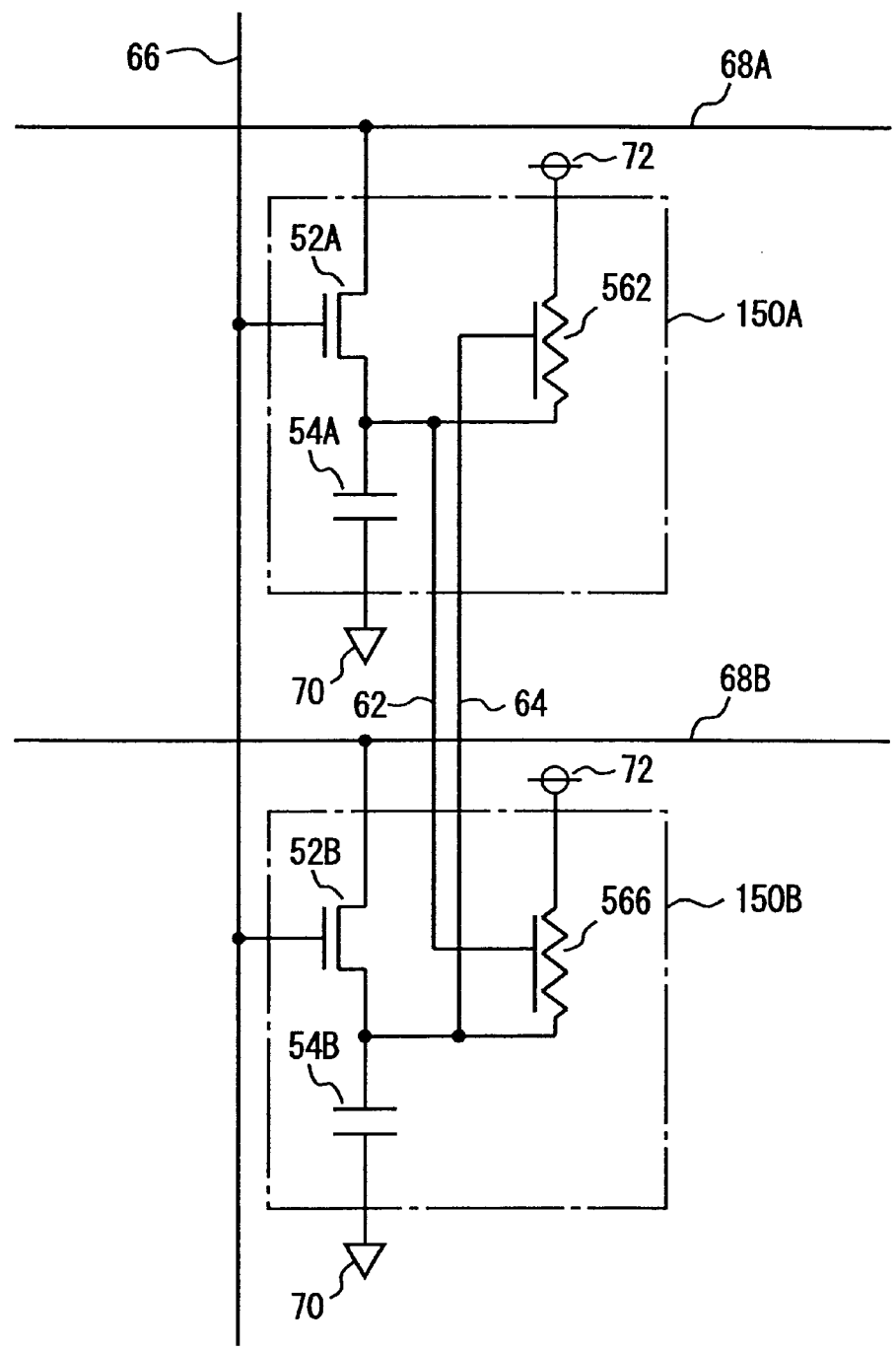
FIG. 4 is a circuit diagram showing the configuration of memory cells arranged in a matrix on a memory cell array in a semiconductor memory device according to a second embodiment.

FIG. 4 is a circuit diagram showing the configuration of memory cells arranged in a matrix on memory cell array 36 in semiconductor memory device 110.

Referring to FIG. 4, memory cells in semiconductor memory device 110 are formed of a twin memory cell consisting of memory cells 150A and 150B. The circuit configuration of memory cells 150A and 150B is similar to that of memory cells 50A and 50B described in the first embodiment except that N-channel MOS transistors 564 and 568 in charge compensating circuits 56A and 56B are not provided. Since the other circuit configuration of memory cells 150A and 150B is similar to that of memory cells 50A and 50B described in the first embodiment, its description will not be repeated.

The configurations and functions of N-channel MOS transistors 52A and 52B and capacitors 54A and 54B as parts other than P-channel TFTs 562 and 566 in memory cells 150A and 150B and the connection configurations of nodes 62 and 64 are also similar to those in the first embodiment, so that their description will not be repeated.

In memory cells 150A and 150B, the leak current from nodes 62 and 64 is compensated by P-channel TFTs 562 and 566 and stored data is held without performing refresh operations.

The operations of memory cells 150A and 150B will be described hereinafter.

(1) Writing of data

The case where data "0" and "1" is written in memory cells 150A and 150B, respectively, will be described hereinafter. Since the case where data "1" and "0" is written in memory cells 150A and 150B, respectively, is similar to the above case, its description will not be repeated.

The operations and states of bit lines 68A and 68B, word line 66, N-channel MOS transistors 52A and 52B, and capacitors 54A and 54B in the data writing operation are the same as those in the first embodiment.

When word line 66 is activated in the data writing operation, N-channel MOS transistor 52A is driven in memory cell 150A and zero voltage is applied from bit line 68A to node 62 via N-channel MOS transistor 52A, thereby turning on P-channel TFT 566 in memory cell 150B.

On the other hand, N-channel MOS transistor 52A in memory cell 150A is driven, simultaneously, N-channel MOS transistor 52B in memory cell 150B is driven, and power supply voltage Vcc is supplied from bit line 68B to node 64 via N-channel MOS transistor 52B, thereby turning off P-channel TFT 562 in memory cell 150A.

Therefore, after that, even if word line 66 is made inactive by regarding that writing of data is completed and N-channel MOS transistors 52A and 52B are turned off, node 62 is maintained at the L level, and node 64 is maintained at the H level.

Since memory cell 150A does not have an N-channel MOS transistor for strongly pulling down node 62 to the L level, a current leak to capacitor 54 due to an OFF-state current of P-channel TFT 562 may occur. However, by reducing the OFF-state current of P-channel TFT 562 to be sufficiently lower than the leak current which exerts an influence on the charge storing state of capacitor 54, concretely, by setting the OFF-state current of P-channel TFT 562 to a current lower than 1/10 of the leak current from node 62, without providing the N-channel MOS transistor for strongly pulling down node 62 to the L level, node 62 is maintained at the L level.

(2) Reading of data

Since a basic data reading operation is similar to that of the first embodiment, its description will not be repeated. In the second embodiment, N-channel MOS transistors 564 and 568 included in memory cells 50A and 50B, respectively, in the first embodiment are not provided, so that memory cells 150A and 150B in the second embodiment do not have the function of pulling charges at nodes 62 and 64 by N-channel MOS transistors 564 and 568 as described in the first embodiment. In the second embodiment, consequently, the voltage in word line 66 cannot be decreased like the first embodiment. Therefore, in semiconductor memory device 110, in a manner similar to a general DRAM, a voltage obtained by boosting the power supply voltage is applied to word line 66.

In such a manner, data is read/written from/to memory cells 150A and 150B.

The number of bulk transistors per bit of semiconductor memory device 110 according to the second embodiment is two, so that the cell area can be largely reduced as compared with a standard SRAM constructed by six bulk transistors.

As described above, since semiconductor memory device 110 according to the second embodiment has the twin memory cell constructed by memory cells 150A and 150B including P-channel TFTs 562 and 566 capable of compensating charges, respectively, unlike the conventional DRAM, refresh operations are unnecessary. Particularly, a memory cell with a cell area largely reduced as compared with that of the conventional SRAM can be realized.

Third Embodiment

The memory cells in semiconductor memory devices 10 and 110 in the first and second embodiments are formed of twin memory cells. In contrast, the memory cells in a semiconductor memory device 210 according to a third embodiment are formed of single memory cells. By disconnecting a charge compensating circuit from a capacitor at the time of reading data, non-destructive reading of data is realized.

Figure 5:
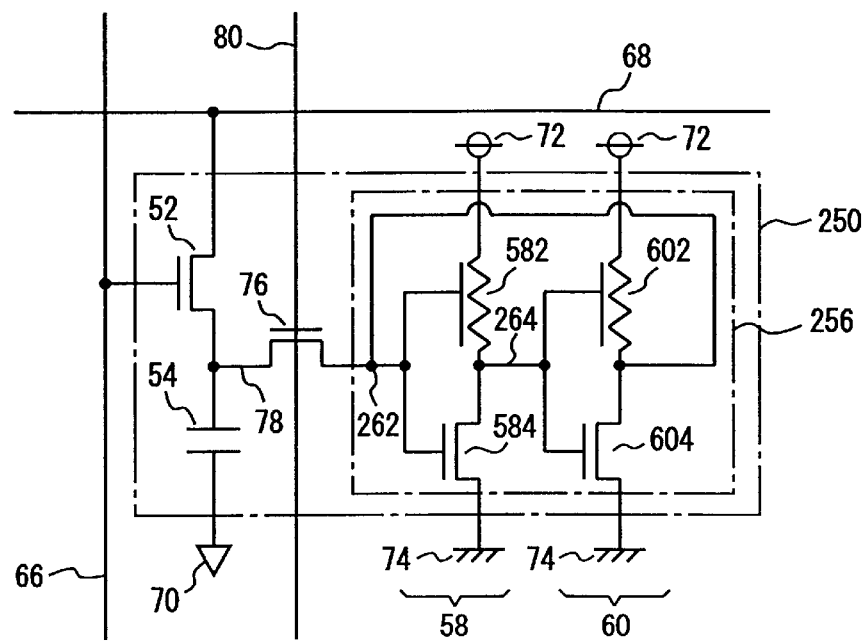
FIG. 5 is a circuit diagram showing the configuration of one of memory cells arranged in a matrix on a memory cell array in a semiconductor memory device according to a third embodiment.

FIG. 5 is a circuit diagram showing the configuration of one of memory cells arranged in a matrix on memory cell array 36 in semiconductor memory device 210.

Referring to FIG. 5, memory cell 250 has an N-channel MOS transistor 52, a capacitor 54, a charge compensating circuit 256, and an N-channel MOS transistor 76. Charge compensating circuit 256 includes inverters 58 and 60 and nodes 262 and 264. Inverter 58 is formed of a P-channel TFT 582 and an N-channel MOS transistor 584, and inverter 60 is formed of a P-channel TFT 602 and an N-channel MOS transistor 604.

N-channel MOS transistor 52 is connected to bit line 68 and capacitor 54, and has gate connected to word line 66. N-channel MOS transistor 52 is an access transistor driven by word line 66 which is activated when data is written or read and in which a memory cell 250 is electrically connected to bit line 68 when data is written or read. Its functions and operations are the same as those of N-channel MOS transistor 52A described in the first and second embodiments.

One end of capacitor 54 is connected to N-channel MOS transistor 52 and the other end is connected to cell plate 70. The functions of capacitor 54 are the same as those of capacitor 54A described in the first and second embodiments.

N-channel MOS transistor 76 is connected to both a node 78 for connecting capacitor 54 to N-channel MOS transistor 52 and node 262, and has a gate connected to an internal signal line 80. N-channel MOS transistor 76 is driven by an internal signal /R outputted from a not-illustrated control circuit to internal signal line 80. When internal signal /R is at the L level, charge compensating circuit 256 is disconnected from node 78.

Figure 6:
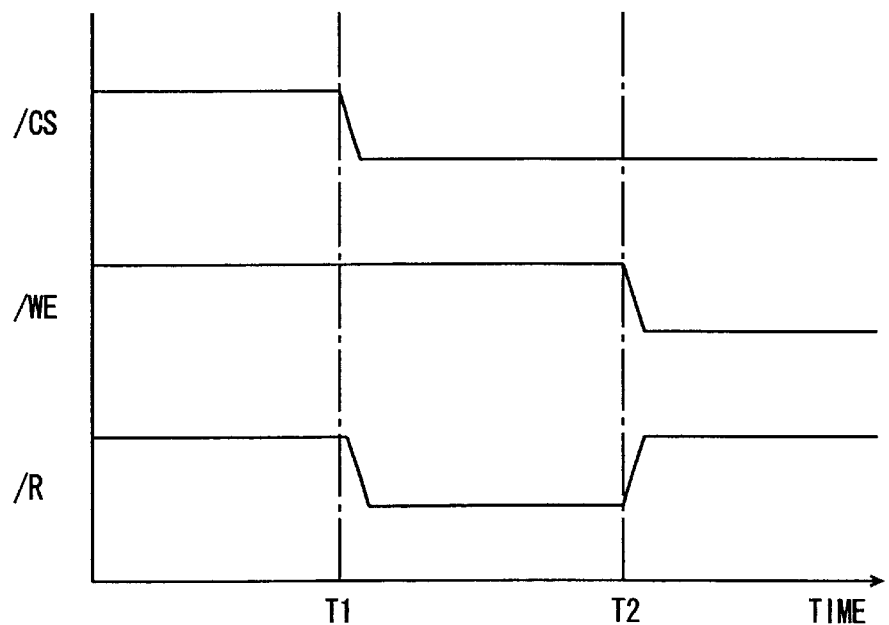
FIG. 6 is a timing chart showing a change in the state of an internal signal /R on an internal signal line shown in FIG. 5.

FIG. 6 is a timing chart showing changes in the status of internal signal /R.

Referring to FIG. 6, internal signal /R is at the H level in a standby period (before timing T1) in which both chip select signal /CS and write enable signal /WE are at the H level. Internal signal /R goes low in a data reading operation (from timing T1 to timing T2) in which chip select signal /CS and write enable signal /WE are at the L and H levels, respectively. Further, internal signal /R goes high in a data writing operation (from timing T2 to timing T3) in which both chip select signal /CS and write enable signal /WE are at the L level.

Therefore, referring again to FIG. 5, N-channel MOS transistor 76 is made inactive only in the data reading operation to disconnect charge compensating circuit 256 from node 78 in the data reading operation.

P-channel TFT 582 is connected to power supply node 72 and node 264, and has a gate connected to node 262. N-channel MOS transistor 584 is connected to node 264 and ground node 74, and has a gate connected to node 262.

P-channel TFT 602 is connected to power supply node 72 and node 262, and has a gate connected to node 264. N-channel MOS transistor 604 is connected to node 262 and ground node 74, and has a gate connected to node 264.

In memory cell 250, by a latch function constituted by inverters 58 and 60, the leak current of capacitor 54 is compensated and stored data is held without performing refresh operations.

The operations of memory cell 250 will be described hereinafter.

(1) Writing of data "0"

In a data writing operation, N-channel MOS transistor 76 is turned on in accordance with internal signal /R, and charge compensating circuit 256 is electrically connected to node 78.

In memory cell 250, the ON-state current of a bulk transistor is approximately $3\times10^{-5}$ A (ampere), and the ON-state current and OFF-state current of a TFT are approximately $1\times10^{-11}$ A and $1\times10^{-13}$ A, respectively. The leak current from nodes 262 and 264 due to the OFF-state current of capacitor 54 and bulk transistor is approximately $1\times10^{-15}$ A. The current values are not limited to those numerical values which are shown as degrees.

With the above-described current values, the ON-state current of each of TFTs becomes higher than the leak current from each of nodes 262 and 264 by four digits. Consequently, nodes 262 and 264 can be charged to the power supply voltage from power supply node 72.

The capacity of node 262 is obtained by the capacity of capacitor 54, gate capacity of the transistor, junction capacity of the active region, and the like. In order to make stored data stably read, the capacity of node 262 is designed to be at least 5 fF (5 f(femto) farad, "f" indicating $10^{-15}$) or larger. On the other hand, the capacity of node 264 is obtained by the gate capacity of a transistor, junction capacity of an active region, and the like. The capacity of node 264 is approximately 1 fF as in a general SRAM. If the capacity of node 262 is the minimum value of 5 fF and the capacity of node 264 is 1 fF, the capacity ratio of nodes 262 and 264 becomes 5.

A preferable capacity ratio is determined by the condition under which data "0" can be written in memory cell 250. The condition will be described hereinafter.

When data "0" is written in memory cell 250, the voltage at node 262 becomes 0V. At the order of n (nano: "n" indicating $10^{-9}$) seconds as usual write operation time, node 264 is not charged to the power supply voltage from power supply node 72. This will be expressed by the following equation.

Assuming now that the power supply voltage of power supply node 72 is 2V, the following equation is satisfied at node 264.

Charge $Q$=Capacity $C$×Voltage $V$=1f×2=2×10$^{-15}$

ON-state current $I$ of P-channel TFT 582=1×10$^{-11}$ amperes

Charging time $t=Q/I$=2×10$^{-4}$ seconds (2)

Therefore, to charge node 264, time of the order of A (micro: "$\mu$" indicating 10$^{-6}$) is required. Consequently, even when the voltage of node 262 becomes 0V, node 264 is not immediately charged to the power supply voltage. Node 262 starts to be charged by power supply node 72 via P-channel TFT 602. If the charging speed of node 262 is faster than that of node 264, node 264 is charged and, before P-channel TFT 602 is turned off, node 262 is recharged. Data "0" once written in node 262 finally becomes data "1" and a write error generates.

However, the capacity ratio of nodes 262 and 264 is higher, the charging speed of node 264 exceeds the charging speed of node 262. Before node 262 is recharged, P-channel TFT 602 is turned off and N-channel MOS transistor 604 is turned on. Consequently, node 262 is pulled down to 0V by MOS transistor 604, and no write error generates.

It can be considered that the capacity ratio of nodes 62 and 64 may be 5 at the minimum in consideration of variations in the threshold voltage of N-channel MOS transistors 584 and 604. To realize writing of data more stably, capacitor 54 to be connected to node 262 is provided. By setting the capacity of capacitor 54 to approximately 20 fF equal to that of a general DRAM, the capacity ratio of nodes 262 and 264 becomes about 20, and writing of data is more stabilized. Considering the facts that the ratio of the ON-state current of P-channel TFT 582 and that of P-channel TFT 602 varies by approximately 10 times and the threshold voltages of N-channel MOS transistors 584 and 604 vary, the capacity ratio of nodes 62 and 64 is desirably 20 or higher.

By setting the predetermined capacity ratio between nodes 262 and 264 as described above, even if word line 66 is made inactive before node 264 is charged to the power supply voltage, no write error in the operation of writing data "0" generates. When the voltage of node 264 exceeds a predetermined voltage, N-channel MOS transistor 604 is turned on, node 262 is held at 0V. After that, without performing refresh operations, the state of written data "0" is maintained.

In the third embodiment, capacitor 54 is provided to realize stable data writing. However, when the capacity ratio of nodes 262 and 264 can be sufficiently assured by the gate capacity of a transistor or the like without providing capacitor 54, capacitor 54 can be made unnecessary.

(2) Writing of data "1"

When data "1" is written into memory cell 250, node 262 is immediately charged from bit line 68 via N-channel MOS transistor 52. Accordingly, N-channel MOS transistor 584 is immediately turned on, and the voltage on node 264 becomes immediately 0V. Therefore, the voltages of nodes 262 and 264 are stabilized early and are not influenced by the performance of a TFT at the time of writing data "1".

Since the ON-state current of P-channel TFT 602 is higher than the leak current from node 262 by four digits, node 262 is held at the power supply voltage by P-channel TFT 602. After that, without refresh operations, the state of written data "1" is held.

Figure 7:
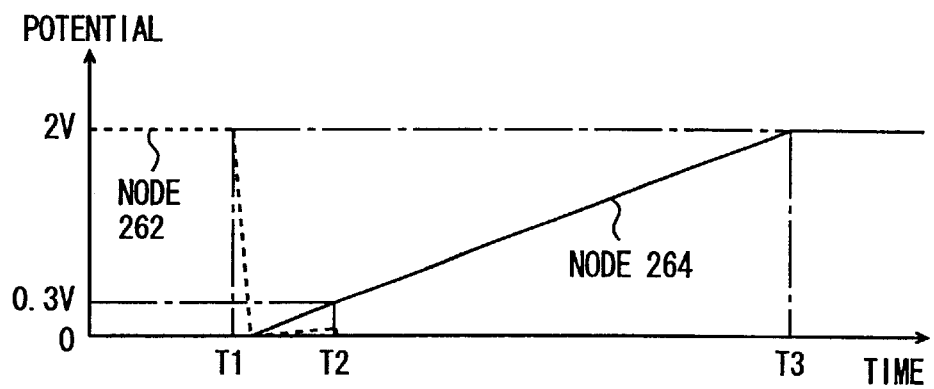
FIG. 7 is a diagram showing a potential change at nodes 262 and 264 when data "0" is written into a memory cell shown in FIG. 5.
Figure 8:
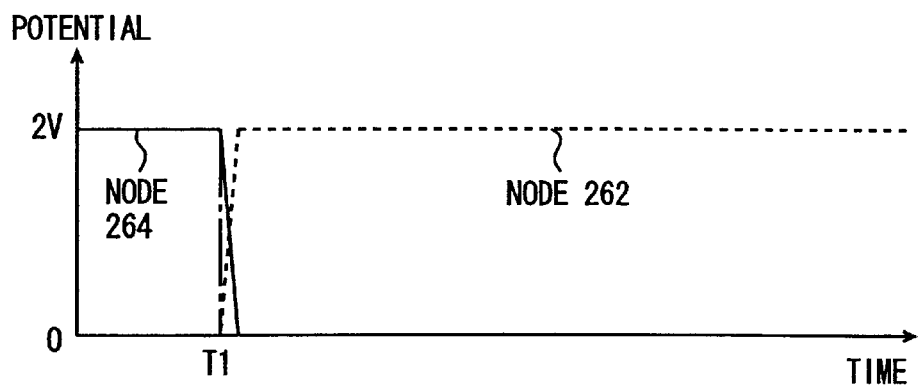
FIG. 8 is a diagram showing a potential change at nodes 262 and 264 when data "1" is written into the memory cell shown in FIG. 5.
Figure 9:
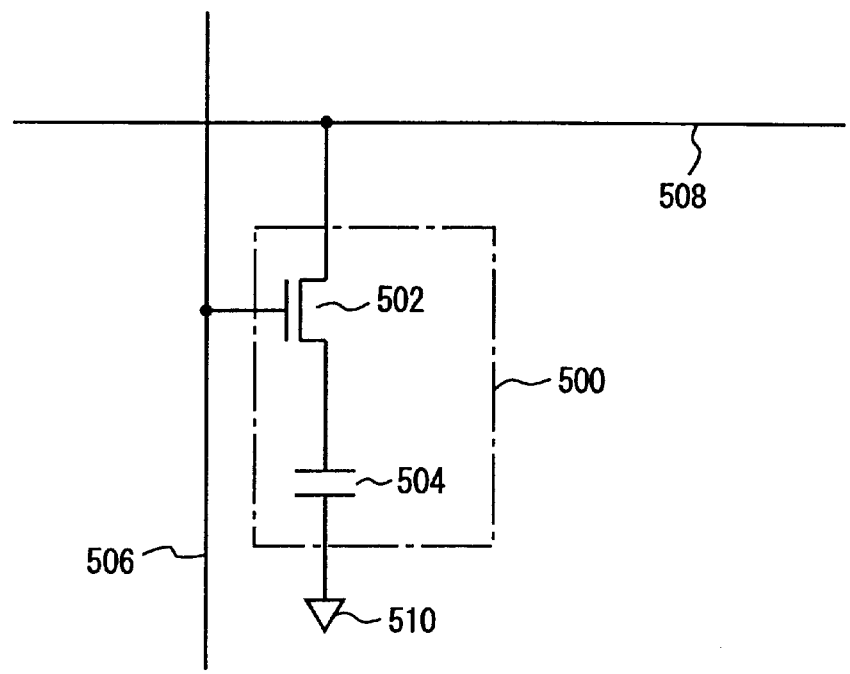
FIG. 9 is a circuit diagram showing the configuration of one of memory cells arranged in a matrix on a memory cell array in a DRAM.

FIGS. 7 and 8 are diagrams showing potential changes at nodes 262 and 264 in the above-described writing operation. FIG. 7 is a diagram showing potential changes at nodes 262 and 264 when data "0" is written into memory cell 250. FIG. 8 is a diagram showing potential changes at nodes 262 and 264 when data "1" is written into memory cell 250.

First, potential changes at nodes 262 and 264 when data "0" is written into memory cell 250 will be described.

Referring to FIG. 7, a broken line indicates a potential change at node 262, and a solid line indicates a potential change at node 264. It is assumed that the power supply voltage is 2V, the logic threshold voltage (an input voltage when an output voltage sharply changes) of inverter 60 is 0.3V, and word line 66 is activated at time T1.

When word line 66 is activated at time T1, charges at node 262 are pulled to bit line 68 via N-channel MOS transistor 52 and the potential at node 262 immediately becomes 0V. Accordingly, node 264 starts to be charged from power supply node 72 via P-channel TFT 582. However, since the ON-state current of the TFT is lower than the ON-state current of a bulk transistor, node 264 is not immediately charged. Consequently, node 262 also starts to be charged from power supply node 72 via P-channel TFT 602. However, in relation to the capacity ratio of nodes 262 and 264, the charging speed of node 262 is lower than that of node 264. Word line 66 is made inactive after tens $\mu$ seconds from time T1.

When the potential of node 264 exceeds a logic threshold voltage 0.3V of inverter 60 at time T2 after about 30$\mu$ seconds from time T1, N-channel MOS transistor 604 is turned on, the voltage at node 262 accordingly becomes 0V, and the written data "0" is stabilized. The time of about 30$\mu$ seconds required for the potential of node 264 to exceed the logic threshold voltage 0.3V of inverter 60 is confirmed on the basis of the following equations.

Charge $Q$ at node 264=Capacity $C$×Voltage $V$=1f×0.3=3×10$^{-16}$

ON-state current $I$ of P-channel TFT 582=1×10$^{-11}$ A

Time t required for potential to reach logic threshold voltage
0.3$V=Q/I$=3×10$^{-5}$ seconds (3)

On the other hand, node 264 is continued to be charged by P-channel TFT 582 and, as shown by the equation (2), charged to 2V of the power supply voltage at time T3 after about 200$\mu$ seconds since the time at which charging of node 264 is started.

Potential changes at nodes 262 and 264 when the data "1" is written in memory cell 250 will now be described.

Referring to FIG. 8, a broken line and a solid line indicate potential changes at nodes 262 and 264, respectively, and it is assumed that word line 66 is activated at time T1. When word line 66 is activated at time T1, node 262 is immediately charged to 2V of the power supply voltage from bit line 68 via N-channel MOS transistor 52. Accordingly, N-channel MOS transistor 584 is immediately turned on and the voltage at node 264 immediately becomes 0V. Therefore, at the time of writing data "1", an influence of the characteristic of the TFT is not exerted.

(3) Reading of data

As described above, in a data reading operation, internal signal /R becomes L level, so that N-channel MOS transistor 76 is turned off and charge compensating circuit 256 is disconnected from node 78. Charge compensating circuit 256 maintains the internal state when it is disconnected.

The configuration of N-channel MOS transistor 52 and capacitor 54 in a state where charge compensating circuit 256 is disconnected from node 78 is the same as that of a conventional DRAM, and the data reading operation can be performed in a manner similar to the conventional DRAM.

To be specific, bit line 68 is precharged to voltage Vcc/2. At the time of reading data, the boosted power supply voltage is applied to word line 66 and word line 66 is activated. By the operation, N-channel MOS transistor 52 is turned on, a very small voltage change on bit line 68 according to the storage state of capacitor 54 is detected by a not-illustrated sense amplifier, and the voltage on bit line 68 is amplified to power supply voltage Vcc or ground voltage GND. The voltage level of bit line 68 corresponds to the state of stored data.

After reading of data, the voltage at node 78 becomes close to precharge voltage Vcc/2, and the voltage state of node 78 before the data reading operation is not maintained. In a conventional DRAM, such a state means destruction of stored data. After the data reading operation, in a state where the voltage on bit line 68 is amplified to voltage Vcc or ground voltage GND, word line 66 is activated again to recharge capacitor 54, and data is rewritten in a manner similar to the operation (1) or (2).

On the other hand, in memory cell 250, after completion of the data reading operation, internal signal /R becomes H level and charge compensating circuit 256 is connected again to node 78. Since charge compensating circuit 256 maintains the state before the data reading operation, when stored data is "1", node 78 is charged to the power supply voltage from power supply node 72 via P-channel TFT 602.

The voltage at node 262 drops once to a voltage close to ½ Vcc immediately after N-channel MOS transistor 76 is connected. However, since the voltage is higher than the logic threshold voltage of 0.3V of inverter 58, inverter 58 is not inverted and the internal state of charge compensating circuit 256 does not change. When stored data is "0", charges of node 78 and capacitor 54 are immediately pulled out by N-channel MOS transistor 604, and the voltage at node 78 becomes 0V without inversion of inverter 58.

As described above, in memory cell 250, in the data reading operation, charge compensating circuit 256 is disconnected from node 78 while holding the state before the data reading operation. Without a difference from a conventional DRAM in the operation of N-channel MOS transistor 52 and the state of capacitor 54 in data reading operation, after completion of the data reading operation, charge compensating circuit 256 is connected again to node 78, charges are charged or discharged by charge compensating circuit 256, and the states of capacitor 54 and node 78 return to the state which is before the data reading operation. Consequently, unlike a conventional DRAM, it is unnecessary to rewrite storage data from the outside of a memory cell by the rewriting operation, and data non-destructive reading is realized.

P-channel TFTs 582 and 602 are used in memory cell 250 for the reason that, in a manner similar to the first embodiment, P-channel TFTs 582 and 602 can be formed on upper layers of N-channel MOS transistors 584 and 604, so that, as compared with a conventional DRAM, although the cell area increases due to N-channel MOS transistors 584, 604, and 76 as bulk transistors, the number of bulk transistors in a memory cell is four, and the cell area can be reduced as compared with a standard SRAM constructed by six bulk transistors.

Further, as one of features of memory cell 250, the cell ratio can be set to a value close to 1 (ratioless).

As described above, in memory cell 250, by providing capacitor 54, the operation of the memory cell is stabilized. Consequently, unlike an SRAM, it is unnecessary to set to the cell ratio to 2 to 3 but the cell ratio can be basically set to almost 1. What the cell ratio can be set to almost 1 denotes a narrower gate width of a driver transistor as compared with a conventional SRAM. From this point of view as well, further reduction in cell area can be realized.

In consideration of stability of the operation of a memory cell, it is not necessary to realize the cell ratio equivalent to that of an SRAM even in memory cell 250. However, it is desirable to set some cell ratio in order to further increase the stability of operation.

In semiconductor memory device 210 according to the third embodiment as described above, memory cell 250 has charge compensating circuit 256 which is disconnected from capacitor 54 while holding the state which is before data reading operation in the data reading operation and is connected again to capacitor 54 after the data reading operation to make the charging state of capacitor 54 return to the state which is before the data reading operation. Thus, data non-destructive reading is realized and refresh operations also become unnecessary.

In the first embodiment, memory cells 50A and 50B are disposed adjacent to each other. Memory cells 50A and 50B may be disposed without being adjacent to each other in accordance with the layout of sense amplifiers connected to bit lines.

In this case, in nodes 62 and 64, as the wiring length increases, the wiring capacitance increases. If the capacity of nodes 62 and 64 of approximately 5 fF or larger can be obtained by the wiring capacitance, capacitors 54A and 54B are not particularly provided. The structure of a memory cell is thereby simplified.

On the other hand, in the case of disposing memory cells 50A and 50B adjacent to each other, bit lines 68A and 68B can be routed in parallel and close to each other. Even if external noise generates in one of the bit lines, noises in bit lines 68A and 68B have the same phase. Consequently, the noises are canceled off in a differential type sense amplifier, and resistance to noise is improved.

Although the precharge voltage to the bit line at the time of reading data is set to ½ Vcc, the precharge voltage may be the power supply voltage Vcc. In this case, when the stored data is "1" and the voltage at the storage node is power supply voltage Vcc, the potential at the storage node does not decrease due to the data reading operation, so that more stable non-destructive reading can be realized.

The above description regarding the layout of memory cells and the precharge voltage can be similarly applied to the second embodiment.

Further, in the first to third embodiments, all of bulk transistors are formed of N-channel MOS transistors. However, all of bulk transistors may be formed of P-channel MOS transistors. In this case, N-channel TFTs are used in place of P-channel TFTs 562 and 566 in the first and second embodiments, and N-channel TFTs are used in place of P-channel TFTs 582 and 602 in the third embodiment. In the second embodiment, the N-channel TFTs used in place of P-channel TFTs 562 and 566 are not connected to power supply node 72 but are connected to ground node 74.

Further, in semiconductor memory device 10 shown in FIG. 1, terminals corresponding to the signals such as row address strobe signal /RAS and column address stroke signal /CAS are included in control terminal 12. The terminals corresponding to the signals may not be provided but the row and column addresses may be simultaneously inputted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a memory cell array including a plurality of memory cells arranged in a matrix; and
a plurality of word lines and a plurality pairs of bit lines and arranged in correspondence with rows and columns of said memory cells, respectively, wherein
each of said plurality of memory cells includes:
a first memory cell for storing data of one bit of stored information expressed by binary information; and
a second memory cell for storing inversion data obtained by inverting said data,
said first memory cell has:
a first capacitive element for holding charges according to a logic level of said data;
a first access transistor driven by a voltage applied to said word line, for transferring charges between one bit line of said pair of bit lines and said first capacitive element; and
a first charge compensating circuit for compensating charges leaked from said first capacitive element, and
said second memory cell has:
a second capacitive element for holding charges according to a logic level of said inversion data;
a second access transistor driven by the voltage applied to said word line, for transferring charges between the other bit line of said pair of bit lines and said second capacitive element; and
a second charge compensating circuit, for compensating charges leaked from said second capacitive element.

2. The semiconductor memory device according to claim 1, wherein
said first and second charge compensating circuits are formed of first and second inverters, respectively,
an output node of said first charge compensating circuit is connected to a first storage node for connecting said first capacitive element to said first access transistor,
an input node of said first charge compensating circuit is connected to a second storage node for connecting said second capacitive element to said second access transistor,
an output node of said second charge compensating circuit is connected to said second storage node, and
an input node of said second charge compensating circuit is connected to said first storage node.

3. The semiconductor memory device according to claim 2, wherein
each of said first and second access transistors is first N-channel MOS transistor, and
each of said first and second inverters has:
a resistive element made of polycrystalline polysilicon whose one end is connected to a power supply node and whose other end is connected to an output node; and
a second N-channel MOS transistor whose one end is connected to an output node and whose other end is connected to a ground node.

4. The semiconductor memory device according to claim 3, wherein
a current driving capability of said second N-channel MOS transistor is in a range from a current driving capability of said first N-channel MOS transistor to a current driving capability twice as high as that of said first N-channel MOS transistor inclusive.

5. The semiconductor memory device according to claim 3, wherein
when said data is read from each of said plurality of memory cells, a voltage equal to or lower than a power supply voltage is applied to a word line corresponding to each of said plurality of memory cells.

6. The semiconductor memory device according to claim 5, wherein
said voltage applied to the word line corresponding to each of said plurality of memory cells is set so that a current driving capability of said first N-channel MOS transistor becomes equal to or higher than the half of a current driving capability of said second N-channel MOS transistor.

7. The semiconductor memory device according to claim 3, wherein
said resistive element is formed of a P-channel thin film transistor.

8. The semiconductor memory device according to claim 3, wherein
said resistive element has a current supply capability which is ten times as high as that of a leak current leaked from said first and second storage nodes or higher.

9. The semiconductor memory device according to claim 1, wherein
said first and second charge compensating circuits are formed of first and second P-channel thin film transistors, respectively,
one end of said first P-channel thin film transistor is connected to a power supply node, the other end is connected to a first storage node for connecting said first capacitive element to said first access transistor, and said first P-channel thin film transistor has a gate connected to a second storage node for connecting said second capacitive element to said second access transistor, and
one end of said second P-channel thin film transistor is connected to the power supply node, the other end is connected to said second storage node, and said second P-channel thin film transistor has a gate connected to said first storage node.

10. The semiconductor memory device according to claim 1, wherein
said first and second memory cells are disposed adjacent to each other,
said one bit line and said other bit line are routed in parallel to each other.

11. A semiconductor memory device comprising:
a memory cell array including a plurality of memory cells arranged in a matrix;
a plurality of word lines and a plurality of bit lines arranged, respectively, in correspondence with rows and columns of said memory cells; and
a plurality internal signal lines disposed in correspondence with rows of said memory cells, wherein
each of said plurality of memory cells includes:
a capacitive element for holding charges according to a logic level of data of one bit of stored information expressed by binary information;
a first transistor driven by a voltage applied to said word line, for transferring said charges between said bit line and said capacitive element;
a charge compensating circuit for compensating charges leaked from said capacitive element in accordance with a logic level of said data; and a second transistor connected between a storage node for connecting said capacitive element to said first transistor and said charge compensating circuit, and said second transistor is driven by a voltage applied to said internal signal line, and disconnects said charge compensating circuit from said storage node at the time of reading said data.

12. The semiconductor memory device according to claim 11, wherein said charge compensating circuit includes:

a first inverter having an input node connected to said second transistor; and a second inverter having an input node connected to an output node of said first inverter and having an output node connected to the input node of said first inverter, said first and second transistors are first and second N-channel MOS transistors, respectively, and each of said first and second inverters includes:

a P-channel thin film transistor whose one end is connected to a power supply node and whose other end is connected to an output node; and a third N-channel MOS transistor whose one end is connected to the output node and whose other end is connected to a ground node.

* * * * *